United States Patent [19]
Wiggins

[11] 4,443,859
[45] Apr. 17, 1984

[54] SPEECH ANALYSIS CIRCUITS USING AN INVERSE LATTICE NETWORK

[75] Inventor: Richard H. Wiggins, Dallas, Tex.

[73] Assignee: Texas Instruments Incorporated, Dallas, Tex.

[21] Appl. No.: 280,742

[22] Filed: Jul. 6, 1981

[51] Int. Cl.³ .................. G06F 15/31; G10L 1/00
[52] U.S. Cl. ............................. 364/724; 381/41
[58] Field of Search ........... 364/724; 179/1 SA, 1 SM

[56] References Cited

U.S. PATENT DOCUMENTS

| | | | |
|---|---|---|---|
| 3,662,115 | 5/1972 | Saito et al. | 179/15 A |
| 3,892,919 | 7/1975 | Ichikawa | 179/1 SM |
| 3,930,147 | 12/1975 | Bellanger et al. | 364/724 |
| 4,052,563 | 10/1977 | Noda et al. | 179/1 SA |
| 4,117,541 | 9/1978 | Ali | 364/724 |
| 4,125,900 | 11/1978 | Betts | 364/724 |
| 4,209,844 | 6/1980 | Brantingham et al. | 364/724 |
| 4,340,781 | 7/1982 | Ichikawa et al. | 179/1 SA |
| 4,378,469 | 3/1983 | Fette | 179/1 SA |

OTHER PUBLICATIONS

Bayless et al., "Voice Signals: Bit-by-Bit", *IEEE Spectrum*, Oct. 1973, pp. 28–34.

Makhoul, "Linear Prediction: A Tutorial Review", *Proceeding of the IEEE*, vol. 63, Apr. 1975, pp. 561–580.

Wiggins, "Low Cost Voice Response Systems Based on Speech Synthesis", *SAE Technical Paper Series No. 800192*, Feb. 1980.

*Primary Examiner*—David H. Malzahn
*Attorney, Agent, or Firm*—William E. Hiller; Leo N. Heiting; Melvin Sharp

[57] ABSTRACT

An adaptive filter suitable for speech analysis which is constructable on a silicon chip. The filter has a single multiplier and a single adder in series together with appropriate registers or memories so that the output of the adder is either looped back to the adder itself or alternatively is looped, after a delay, to the multiplier so as to perform the operations of an all-zero digital lattice filter in computing a moving average, employing linear predictive coding. Another register provides the multiplier with the constant values typically associated with lattice filter coefficients. Preferably the multiplier is an M-stage pipeline multiplier so as to reduce the area necessary for its incorporation on a silicon chip. The filter accepts digital samples of the voice input and outputs a compressed data representation of the input.

17 Claims, 13 Drawing Figures

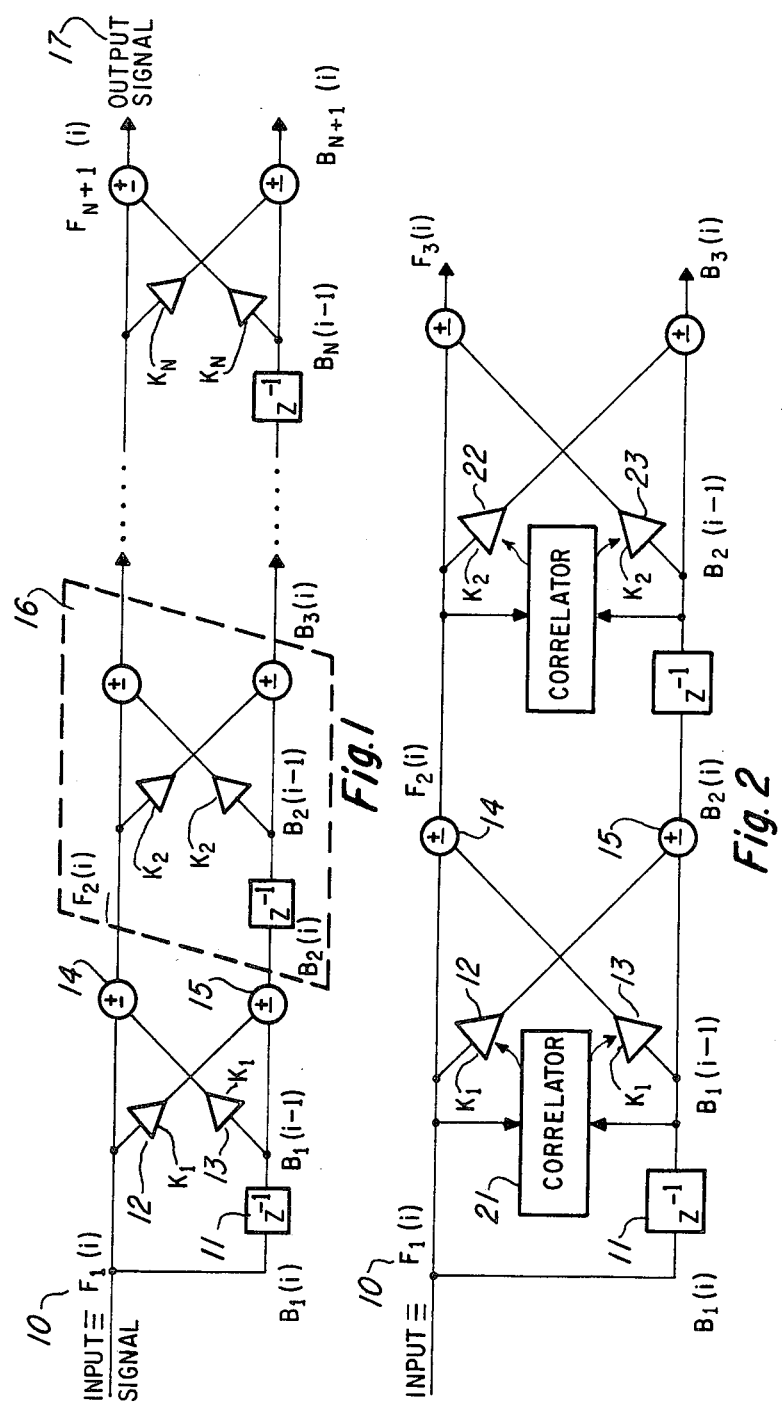

| TIME | MULT. K INPT. (31) | MULT. 2ND INPT. (32) | ADDER INPT. (MULT.) (33) | ADDER 2ND INPT. (34) | 6 PER. DELAY INPT. (35) | 20 PER. DELAY INPT. (36) | DOUBLE SHIFT REGISTER OUTPUT |
|---|---|---|---|---|---|---|---|
| 17 | $K_1$ | $B_1(I-1)$ | $K_7F_7(I-1)$ | $B_7(I-2)$ | $B_7(I-1)$ | $B_7(I-1)$ | |
| 18 | $K_2$ | $B_2(I-1)$ | $K_8F_8(I-1)$ | $B_8(I-2)$ | $B_8(I-1)$ | $B_8(I-1)$ | $I-1$ (44) |
| 19 | $K_3$ | $B_3(I-1)$ | $K_9F_9(I-1)$ | $B_9(I-2)$ | $B_9(I-1)$ | $B_9(I-1)$ | |
| 20 | $K_4$ | $B_4(I-1)$ | $K_{10}F_{10}(I-1)$ | $B_{10}(I-2)$ | $B_{10}(I-1)$ | $B_{10}(I-1)$ | |
| 1 | $K_5$ | $B_5(I-1)$ | $K_1B_1(I-1)$ | $F_1(I)$ | $F_1(I)$ | $B_{11}(I-1)$ | |
| 2 | $K_6$ | $B_6(I-1)$ | $K_2B_2(I-1)$ | $F_2(I)$ | $F_2(I)$ | $F_2(I)$ | |
| 3 | $K_7$ | $B_7(I-1)$ | $K_3B_3(I-1)$ | $F_3(I)$ | $F_3(I)$ | $F_3(I)$ | |
| 4 | $K_8$ | $B_8(I-1)$ | $K_4B_4(I-1)$ | $F_4(I)$ | $F_4(I)$ | $F_4(I)$ | |
| 5 | $K_9$ | $B_9(I-1)$ | $K_5B_5(I-1)$ | $F_5(I)$ | $F_5(I)$ | $F_5(I)$ | |
| 6 | $K_{10}$ | $B_{10}(I-1)$ | $K_6B_6(I-1)$ | $F_6(I)$ | $F_6(I)$ | $F_6(I)$ | |
| 7 | $K_1$ | $F_1(I)$ | $K_7B_7(I-1)$ | $F_7(I)$ | $F_7(I)$ | $F_7(I)$ | |
| 8 | $K_2$ | $F_2(I)$ | $K_8B_8(I-1)$ | $F_8(I)$ | $F_8(I)$ | $F_8(I)$ | |
| 9 | $K_3$ | $F_3(I)$ | $K_9B_9(I-1)$ | $F_9(I)$ | $F_9(I)$ | $F_9(I)$ | |
| 10 | $K_4$ | $F_4(I)$ | $K_{10}B_{10}(I-1)$ | $F_{10}(I)$ | $F_{10}(I)$ | $F_{10}(I)$ | $I$ (43) |
| 11 | $K_5$ | $F_5(I)$ | $K_1F_1(I)$ | $B_1(I-1)$ | $F_{11}(I)$ | $F_{11}(I)$ | $F_1(I)$ |
| 12 | $K_6$ | $F_6(I)$ | $K_2F_2(I)$ | $B_2(I-1)$ | $B_2(I)$ | $B_2(I)$ | |
| 13 | $K_7$ | $F_7(I)$ | $K_3F_3(I)$ | $B_3(I-1)$ | $B_3(I)$ | $B_3(I)$ | |
| 14 | $K_8$ | $F_8(I)$ | $K_4F_4(I)$ | $B_4(I-1)$ | $B_4(I)$ | $B_4(I)$ | |
| 15 | $K_9$ | $F_9(I)$ | $K_5F_5(I)$ | $B_5(I-1)$ | $B_5(I)$ | $B_5(I)$ | |
| 16 | $K_{10}$ | $F_{10}(I)$ | $K_6F_6(I)$ | $B_6(I-1)$ | $B_6(I)$ | $B_6(I)$ | |
| 17 | $K_1$ | $B_1(I)$ | $K_7F_7(I)$ | $B_7(I-1)$ | $B_7(I)$ | $B_7(I)$ | |
| 18 | $K_2$ | $B_2(I)$ | $K_8F_8(I)$ | $B_8(I-1)$ | $B_8(I)$ | $B_8(I)$ | |
| 19 | $K_3$ | $B_3(I)$ | $K_9F_9(I)$ | $B_9(I-1)$ | $B_9(I)$ | $B_9(I)$ | |
| 20 | $K_4$ | $B_4(I)$ | $K_{10}F_{10}(I)$ | $B_{10}(I-1)$ | $B_{10}(I)$ | $B_{10}(I)$ | |
| 1 | $K_5$ | $B_5(I)$ | $K_1B_1(I)$ | $F_1(I+1)$ | $F_1(I+1)$ | $B_{11}(I)$ | $I+1$ (45) |
| 2 | $K_6$ | $B_6(I)$ | $K_2B_2(I)$ | $F_2(I+1)$ | $F_2(I+1)$ | $F_2(I+1)$ | |

Fig. 4

| TIME | MULT. K INPT. | MULT. 2ND INPT. | ADDER INPT. (MULT.) | ADDER 2ND INPT. | 6 PER. DELAY INPT. | 20 PER. DELAY INPT. | DOUBLE SHIFT REGISTER OUTPUT | |
|---|---|---|---|---|---|---|---|---|
| 17 | $K_1$ | $B_1(I-1)$ | $K_7F_7(I-1)$ | $B_7(I-2)$ | $B_7(I-1)$ | $B_7(I-1)$ | | |
| 18 | $K_2$ | $B_2(I-1)$ | $K_8F_8(I-1)$ | $B_8(I-2)$ | $B_8(I-1)$ | $B_8(I-1)$ | | |
| 19 | $K_3$ | $B_3(I-1)$ | $K_9F_9(I-1)$ | $B_9(I-2)$ | $B_9(I-1)$ | $B_9(I-1)$ | | $\}I-1$ |
| 20 | $K_4$ | $B_4(I-1)$ | $GF_{10}(I-1)$ | $\phi$ | $B_{10}(I-1)$ | $B_{10}(I-1)$ | | |
| 1 | $K_5$ | $B_5(I-1)$ | $K_1B_1(I-1)$ | $F_1(I)$ | $F_1(I)$ | $B_{11}(I-1)$ | | |
| 2 | $K_6$ | $B_6(I-1)$ | $K_2B_2(I-1)$ | $F_2(I)$ | $F_2(I)$ | $F_2(I)$ | | |
| 3 | $K_7$ | $B_7(I-1)$ | $K_3B_3(I-1)$ | $F_3(I)$ | $F_3(I)$ | $F_3(I)$ | | |
| 4 | $K_8$ | $B_8(I-1)$ | $K_4B_4(I-1)$ | $F_4(I)$ | $F_4(I)$ | $F_4(I)$ | | |
| 5 | $K_9$ | $B_9(I-1)$ | $K_5B_5(I-1)$ | $F_5(I)$ | $F_5(I)$ | $F_5(I)$ | | |
| 6 | $K_{10}$ | $B_{10}(I-1)$ | $K_6B_6(I-1)$ | $F_6(I)$ | $F_6(I)$ | $F_6(I)$ | | |
| 7 | $K_1$ | $F_1(I)$ | $K_7B_7(I-1)$ | $F_7(I)$ | $F_7(I)$ | $F_7(I)$ | | |
| 8 | $K_2$ | $F_2(I)$ | $K_8B_8(I-1)$ | $F_8(I)$ | $F_8(I)$ | $F_8(I)$ | | |
| 9 | $K_3$ | $F_3(I)$ | $K_9B_9(I-1)$ | $F_9(I)$ | $F_9(I)$ | $F_9(I)$ | | |
| 10 | $K_4$ | $F_4(I)$ | $K_{10}B_{10}(I-1)$ | $F_{10}(I)$ | $F_{10}(I)$ | $F_{10}(I)$ | | |
| 11 | $K_5$ | $F_5(I)$ | $K_1F_1(I)$ | $B_1(I-1)$ | $F_{11}(I)$ | $F_{11}(I)$ | $F_1(I)$ | |
| 12 | $K_6$ | $F_6(I)$ | $K_2F_2(I)$ | $B_2(I-1)$ | $B_2(I)$ | $B_2(I)$ | | |
| 13 | $K_7$ | $F_7(I)$ | $K_3F_3(I)$ | $B_3(I-1)$ | $B_3(I)$ | $B_3(I)$ | | |
| 14 | $K_8$ | $F_8(I)$ | $K_4F_4(I)$ | $B_4(I-1)$ | $B_4(I)$ | $B_4(I)$ | | $\}I$ |
| 15 | $K_9$ | $F_9(I)$ | $K_5F_5(I)$ | $B_5(I-1)$ | $B_5(I)$ | $B_5(I)$ | | |
| 16 | $G$ | $F_{10}(I)$ | $K_6F_6(I)$ | $B_6(I-1)$ | $B_6(I)$ | $B_6(I)$ | | |
| 17 | $K_1$ | $B_1(I)$ | $K_7F_7(I)$ | $B_7(I-1)$ | $B_7(I)$ | $B_7(I)$ | | |
| 18 | $K_2$ | $B_2(I)$ | $K_8F_8(I)$ | $B_8(I-1)$ | $B_8(I)$ | $B_8(I)$ | | |
| 19 | $K_3$ | $B_3(I)$ | $K_9F_9(I)$ | $B_9(I-1)$ | $B_9(I)$ | $B_9(I)$ | | |
| 20 | $K_4$ | $B_4(I)$ | $GF_{10}(I)$ | $\phi$ | $B_{10}(I)$ | $B_{10}(I)$ | | |
| 1 | $K_5$ | $B_5(I)$ | $K_1B_1(I)$ | $F_1(I+1)$ | $F_1(I+1)$ | $B_{11}(I)$ | | $\}I+1$ |
| 2 | $K_6$ | $B_6(I)$ | $K_2B_2(I)$ | $F_2(I+1)$ | $F_2(I+1)$ | $F_2(I+1)$ | | |

*Fig.12*

SPEECH ANALYSIS CIRCUITS USING AN INVERSE LATTICE NETWORK

BACKGROUND

This invention relates to the generation of a compressed digital representation of a digital sample input typically representative of speech. The transformation utilizes a digital lattice filter approach which can be implemented on a single silicon chip. The filter has a single multiplier, preferably a M-stage pipeline multiplier, and a single adder. The filter permits the input of voiced speech and the subsequent output of digital data so as to accomplish the analysis of human speech.

Several methods are currently being used and experimented with to digitize human speech. For example, pulse code modulation, differential pulse code modulation, adaptive predictive coding, delta modulation, channel vocoders, cepstrum vocoders, formant vocoders, voice excited vocoders, and linear predictive coding methods of speech digitalization are well known. These methods are briefly explained in "Voice Signals: Bit by Bit" (pages 28–34 in the Oct. 1973 issue of IEEE Spectrum).

Once the human speech is digitized, it is susceptible to being synthesized at a later desired time through the use of various electronics. Computer simulations of the various speech digitalization methods have generally shown that the linear predictive methods of digitizing speech can produce speech having greater voice naturalness than the previous vocoder systems (i.e. channel vocoders) and at a lower data rate than the pulse coded modulation systems. As the number of stages in the digital filter increases, the more natural the sound of the generated speech will be. A device which utilizes linear predictive coding in implementing a lattice filter is disclosed in U.S. Pat. No. 4,209,844 issued to Brantingham et al on June 24, 1980, and a speech synthesis system relying upon the selective connection of speech sound waveforms extracted from natural voice is disclosed in U.S. Pat. No. 3,892,919 issued to Ichikawa on July 1, 1975, both incorporated hereinto by reference.

Prior to any synthesis of speech, the proper data must be collected and formated. Perhaps the simplest and most commonly used method for obtaining the speech parameters is to analyze actual speech signals. In this approach, speech is recorded so as to allow a short time spectral analysis of the signal many times each second to obtain the appropriate spectral parameters as a function of time. A second analysis is then performed to determine the appropriate excitation parameters. This process decides if the speech is voiced or unvoiced and when it is voiced, the appropriate pitch values are computed. When the parameters controlling the synthesizer have been carefully determined, the resulting synthetic speech sounds identical to the original. For a good analysis of speech synthesis refer to the SAE Technical Paper Series No. 800197 entitled "Low Cost Voice Response Systems Based On Speech Synthesis" by Richard Wiggins given in Detroit on Feb. 25–29, 1980, incoporated hereinto by reference.

Other methods exist which do not utilize the linear predictive coding approach. The efficient representation of speech signals in terms of a small number of slowly varying parameters is a problem of considerable importance in speech research. Most methods for analyzing speech start by transforming the acoustic data into a spectral form by performing a short-time analysis on the speech wave. Although spectral analysis is a well known technique for stationary signals, its application to speech signals suffers from a number of serious limitations arising from the non-stationary as well as the quasi-periodic properties of the speech wave. For this reason, methods based on spectral analysis do not always provide an accurate description of the speech articulation.

Efficient speech analysis also provides for a recognition system in which a security method for operation is performable. Speech analysis permits voiced entry into a computer or other processor and thereby absolutely controls access. In such systems, the analysis parameters are matched with reference data in order to verify or reject the claimed identity of a speaker. A speech analysis system may also be used in a speech recognition system which permits, for example, the entry of data into a computer by means of voice.

It has been recognized that the used of linear prediction performs extremely well in the analysis of signals. Linear production frequently utilizes what is referred to as a lattice filter in which a moving average is computed through the use of multipliers, adders, and delays to result in a single output signal. For a good review of linear prediction analysis techniques refer to the article by John Makhoul entitled "Linear Prediction: A Tutorial Review" found in IEEE Vol. 63 pp. 561–580 (April 1975), incorporated hereinto by reference.

A handicap which has hindered the development of sequential linear prediction analysis is that for an N-stage filter, 2N additions, 2N multiplications, and N delay operations must be performed on each speech data sample, where N is the order of analysis. This limitation requires the use of a large digital computer or the pacing of the input so that analysis may be performed. Through the use of pacing, a lower computer is fed the sample data at a much lower rate than would be encountered in real time processing constraints. This technique reduces the speed of operation but increases the amount of memory required to buffer the sampled speech signal.

Accordingly, linear prediction has not been used by small computers or with portable units for analyzing speech, since this technique requires either the bulk and mass of a large computer or the unrealistic technique of pacing the input data.

DESCRIPTION OF THE INVENTION

The present invention provides an adaptive filter utilizing the lattice filter approach so as to provide speech analysis capabilities. Additionally the adaptive filter of this invention may be implemented on a single silicon chip which provides for its portability, low cost, and encourages wide spread use.

The present adaptive filter eliminates the need for a pluality of multipliers and a plurality of adders by having a single multiplier and a single adder in which the resultant of the adder is looped, either directly or via a delay register, to the multiplier or to the adder. The output of the multiplier is directed to the adder at all times.

The lattic filter solves the iterative function $f_{j+1}(i) = f_j(i) - k_j b_j(i-1)$, for $2 \leq j \leq N$ where, $k_j$ = preselected constant values, (or adaptive coefficients)

i = sample number, and $f_1(i) = b_1(i)$ = externally supplied speech data. A similar computation must be performed for the b values in the lattice filter. That equation is:

$$b_{j+1}(i) = b_j(i-1) - k_j f_j(i), \text{ for } 2 \leq j \leq N \text{ where,}$$

$k_j$ = preselected constant values,
i = sample number, and
$f_1(i) = b_1(i)$ = the externally supplied speech data.

The value N is the degree of the filter. As the degree is increased, a more accurate spectral approximation is gained. The trade off for more precision results in a larger number of operations which takes longer to complete. In the preferred embodiment, N=10.

In the lattice filter of the present invention, the $f_j$ values, according to the above equations, are computed through j=N. This yields the output value of $f_{11}(i)$. The filter then computes the $b_j$ values through j=N. The $b_j$ values are stored or delayed until they are needed to compute the $f_j$ values for the next speech data sample. An N stage filter therefore requires 2N time periods for the complete processing of a single speech data sample.

The multiplier is preferably an M-stage pipeline multiplier, thus requiring the multiplicand to be initiated M time periods prior to the need of the resultant. As an example, assume that a 4-stage pipelined multiplier is used; to obtain the product $k_j b_j(i-1)$ for any j value, at a time of t, then the values $k_j$ and $b_j(i-1)$ must be communicated to the 4-stage pipelined multiplier at time t-4.

To perform this timing function the appropriate controls must be utilized. These controls consist of either a memory means storing the values to be selectably withdrawn, or in the preferred embodiment, registers which divulge the values at the appropriate time.

As is seen by the equations above for $f_{j+1}(i)$ and $b_{j+1}(i)$, the multiplier must perform its operation utilizing the preselected constants and either the previously determined $b_j$ values or the previously determined $f_j$ values. For the iterative addition of the $b_j$ values and the $f_j$ values, the output of the ader is looped back to the input of the adder. The output of the adder is stored as discussed above so as to be used by the multplier.

The $k_j$ values are nonvolatile in this example. In some embodiments of the invention, the $k_j$ values are periodically updated. A memory means is supplied which stores the $k_j$ values. This memory means is a read only memory (ROM) or preferably a register device. In this case the invention provides a non-time varying all zero digital filter for sampled data. The use of a register device is preferred since it allows the N values of $k_j$ to be shifted into the register and to be withdrawn on a first-in first-out (FIFO) approach. The FIFO method allows the shift register to act as a stack so that the most current and the needed value is withdrawn, thereby reducing the amount of control operations which must be performed. New values added to the stack float to the output of the register in due course.

Another embodiment of the invention allows the filter characteristics to be updated by changing the $k_j$ values. The embodiment provides a time varying all-zero digital filter which automatically updates so as to cope with changing conditions.

The adder combines the output from the multiplier with either the previously determined $b_j$ values or the previously computed $f_j$ values. Since those values have been determined at an earlier stage, they similarly must be stored until they are needed. Again the use of a memory such as a random access memory (RAM) or the use of a stack register having the appropriate number of registers therein is utilized.

The input data to the adder comes one from the register and one from the output of the multiplier. The output of the adder is fed either back to the register, to the multiplier, or alternatively is provided as an output value. The appropriate timing is utilized so that the initial input $f_1(i)$ is introduced into the series of computations at the appropriate stage.

The $b_{N+1}$ value serves no purpose since it is not utilized in computing subsequent $f_j$ values. In the preferred embodiment, the multiplication and addition used for this computation are utilized to establish a gain factor either on the output, $f_{N+1}$, or upon the speech input data $f_1$. This operation requires that the gain value be interposed in the appropriate spot, and that the output value, $f_{N+1}$, or the speech input data, $f_1$ be channeled to the multiplier appropriately. This timing and channeling is accomplished via the use of registers and switches.

Another embodiment of the invention utilizes an autocorrelator so as to update the stored constant values, $k_j$. This autocorrelator utilizes the $f_j(i)$ value and the $b_j(i-1)$ value to compute the $k_j$ factor. In this manner, the kj so computed provides an effective means of obtaining a spectral analysis of the incoming sampled data signal. In the preferred embodiment, the speech data input is every twenty miliseconds; the filter is a ten-stage lattice filter. The multiplier is preferably a four-stage pipeline multiplier; but depending on the gate delays of the semiconductor fabrication technology, the multiplier may have more, or even less stages. A single stage multiplier is also contemplated, as an alternate embodiment.

Since the device may be implemented on a single silicon chip, it has a dramatically reduced cost and therefore has applicability to more situations which require low cost and portability.

DRAWINGS IN BRIEF

FIG. 1 is a schematic diagram of a lattice filter.

FIG. 2 is an enlarged view of the lattice filter of FIG. 1 in which a correlator is used to update the $k_j$ values.

FIG. 4 is a timing table listing the various intermediate results available in the filter of FIG. 3 at various time periods of a cycle.

FIG. 12 is a timing table listing the various intermediate results available in the filter of FIG. 11 at various time periods of a cycle.

DRAWINGS IN DETAIL

Figure 3:
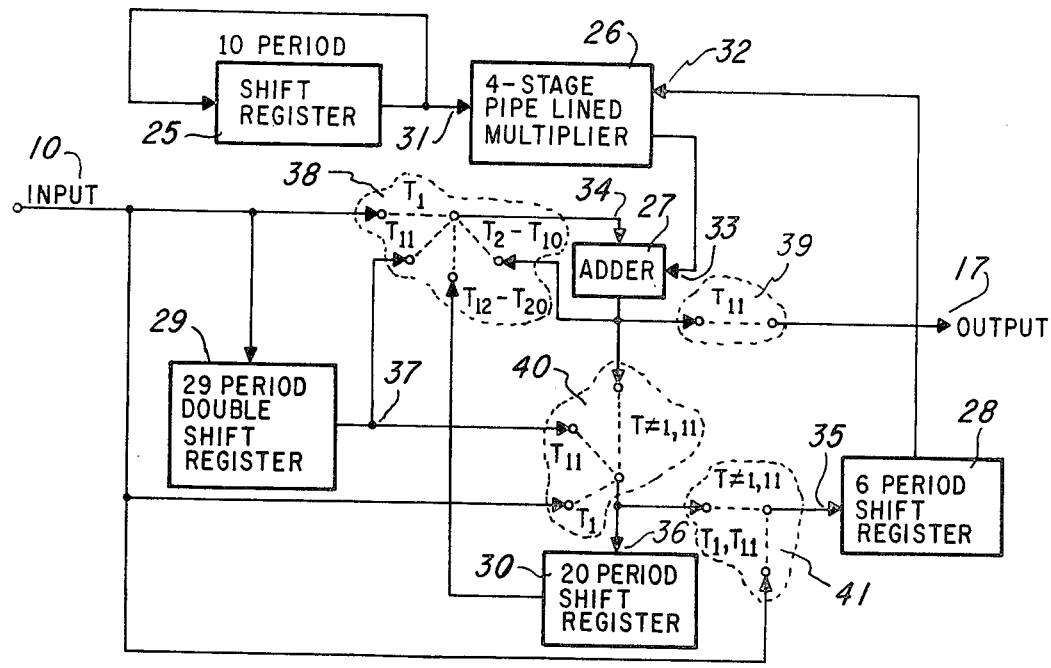
FIG. 3 is an architectural block diagram of an embodiment of the invention.

FIG. 1 is a schematic of a lattice filter. The lattice filter solves the following equations:

$f_1(i) = b_1(i)$ = the input speech data $f_{j+1}(i) = f_j(i) - k_j b_j(i-1)$, $b_{j+1}(i) = b_j(i-1) - k_j f_j(i)$; where, i = the sample number, and $k_j$ = predefined constant values (or adaptive coefficients).

Consistent with these equations, the lattice filter initially ties together the speech data input value to $f_1(i)$, 10, and the $b_1(i)$ so as to initialize these values. Thereafter a delay 11 is used on the $b_1(i)$ so as to obtain $b_1(i-1)$. Through the use of the multipliers 12 and 13, the value $k_1$ is multiplied by the appropriate value (the input value 10 or the output of delay 11 respectively) and subsequently, via the adders 14 and 15, the input value 10 or the output of the delay 11 has subtracted from it the appropriate output values of multipliers 13 and 12 respectively.

Each stage 16 of the lattice filter therefore requires two multiplication operations, two addition operations, and a delay operation. This results in a ten-stage lattice filter requiring twenty multiplications, twenty subtractions, and ten delays for each speech input data sample. The sheer logistics of supplying twenty multipliers, twenty adders, and ten delays has kept the utilization of a lattice filter in a voice analysis method prohibitive. Typically, voice analysis has been implemented heretofore on a very large computer or other such device which is not portable and is expensive.

FIG. 2 is a schematic of the lattice filter in which a correlator is added so as to update the multiplier values. As in FIG. 1, the lattice filter of FIG. 2 accepts the speech data input $f_1(i)$, 10, and a delay 11 is used on the $b_1(i)$ to obtain $b_1(i-1)$, followed by a multiplication 13 and addition 14 in achieving the value of $f_2(i)$. Similarly the input 10 is multiplied at 12 and added at 15 so as to create the value $b_2(i)$. In this embodiment a correlator 21 utilizes the values of $f_1(i)$ and $b_1(i-1)$ so as to update the multiplicand values $k_1$.

In like fashion, all of $k_j$'s are updated through the lattice filter. The ability to correlate and update the coefficient $k_j$, allows the device to be updated automatically. Also the $k_j$'s are useful in speech compression and recognition since they represent the short time spectral envelope of the sampled data signal.

As with the lattice filter of FIG. 1, the lattice filter of FIG. 2 suffers from the same handicap since it too must perform a minimum of two multiplications, two additions and one delay for each stage of the filter. The lattice filter of FIG. 2 incorporates the correlator, and as such must perform other mathematical functions so as to update the constant values $k_j$.

FIG. 3 is a block diagram of an embodiment of the invention. The embodiment of FIG. 3 models a ten-stage lattice filter.

A shift register 25 contains a ten-cell register which stores the values $k_1, k_2, k_3, \ldots k_{10}$. These values are communicated to an input port 31 of a four-stage pipeline multiplier 26. In a feedback relationship the $k_j$ values are communicated back to the shift register 25 so as to be an ever replenishing source of values.

The four-stage pipeline multiplier 26 also accepts at its other input port 32 the second value via a six period shift register 28. Since the pipeline multiplier 26 is a four-stage multiplier, four time periods before the multiplication product is needed, it must be initiated. In a ten-stage lattice filter, with a four-stage pipeline multiplier 26, the shift register 28 must be a six-period delay; that is, the number of stages of the filter less the number of stages necessary for the multiplication is the appropriate delay. The product from the pipeline multiplier 26 is communicated to an adder 27 at its input port 33.

The speech input data 10 is communicated in the first time unit, $t_1$, via a switching mechanism 38 to the input port 34 of the adder 27. The other adder input port 33 receives the product from the 4-stage pipeline multiplier 26. The summation from the adder 27 is fed back in a feedback loop relationship for times $t_2$ through $t_{10}$ via the switch 38 to the adder 27 via the input port 34.

Additionally the switch 40 is closed during time $t_2$ through $t_{10}$, so that the summation from the adder 27 is communicated to the input port 36 of a twenty-period shift register 30 and additionally to the six-period shift register 28. The six-period shift register 28 delays the appropriate amount of time until the summation value is needed by the 4-stage pipeline multiplier 26. For times $t_2$ through $t_{10}$ the feedback loop relationship of the multiplier and adder perform the top operations of the lattice filter, as shown in FIG. 1. This computes the $f_j$ values.

At time $t_{11}$, switch 39 closes so that the output 17 is available as the resultant. Additionally at time $t_{11}$ the input value, which has been delayed via the twenty-nine period double shift register 29, is communicated to the input port 36 of the twenty-period shift register 30. Similarly the delayed speech input value from the twenty-nine period double shift register 29 is also communicated, via the switches 38, to the input port 34 of the adder 27. This switching mechanism and delay operation of the twenty-nine period double shift register 29, switches 38, and switches 40 start the process of computing the lower portion of the lattice filter of FIG. 1 from left to right. This computes the $b_j$ values.

Once the apparatus is initialized at $t_{11}$, for times $t_{12}$ through $t_{20}$, the summation of the adder 27 which has been delayed via the twenty-period shift register 30, is communicated back to the input port 34 of the adder 27. This delay permits the previously computed $b_j(i-1)$ values to be withdrawn in the computation of the new $b_j(i)$ values.

The embodiment of FIG. 3 utilizes a single multiplier and a single adder in its operation. Through the use of delays and shift registers, the computed values are stored for the appropriate time until they are needed. The lattice filter accepts an input at $t_1$ and develops an output at $t_{11}$. The lattice filter takes 20 time periods to perform the total operation since 10 of those time units are used to compute the $b_j$ values which are to be used at the next sample iteration.

FIG. 4 is a timing table of the embodiment of FIG. 3.

Referring to FIG. 4 in connection with FIG. 3, the multiplier input 31 and the multiplier input port 32 are described in the first two columns of the timing table after the time column. The computational operation for sample i, 43, begins four time periods before the first time period, 46, of i, 43. That is, the values communicated to the multiplier input 31 and the multiplier input 32 are communicated four time periods before they are needed so that at the first time period 46 of the sample i, 43, the product $k_1b_1(i-1)$ is available for the adder 27. Hence, at time 17 of sample $i-1$, 44, the value $k_1$ is communicated to the multiplier input port 31 and the value $b_1(i-1)$ is communicated to the multiplier input port 32. The product, $k_1b_1(i-1)$, is therefore available at the adder input port 33 at the first period, 46, of sample i, 43.

It is assumed throughout these figures and tables that at the beginning of the time period, the value is communicated via the lines to the next operational block. As an example, the value $k_1b_1(i-1)$ is communicated to the input port 33 of the adder 27 at the beginning of time 1, 46, of sample i, 43. During the time period 1, 46, the addition operation is carried out so that the summation is available at the start of time period 2.

The second input port of the adder 27 at time 1, 46 of sample i, 43 accepts the value $f_1(i)$, the input to the apparatus, and one time period later develops the value defined by $f_1(i)-k_1b_1(i-1)=f_2(i)$. This value, $f_2(i)$, is communicated to the six-period delay input port 35.

The process of multiplying the $k_j$ value by the previously determined $b_j$ value and then adding this product to the currently developed $f_j$ value is continued through time 11 at which time the output switch 39 is closed allowing the final value to be available. Note that in a 10-stage lattice filter, the output at time 11 is not stored; the process is initialized again via the switch 40, and the switch 38 so that the computation of the $b_j$ values for sample i are determined.

In like fashion, four time periods before the product is needed, the values $k_1$ and $f_1(i)$ are communicated to the multiplier input ports 31 and 32 respectively, at time period 7. The product $k_1f_1(i)$ becomes available to the adder at time 11 at the input port 33. The second adder input port 34 receives the previously stored $b_1(i-1)$ value from the twenty-period shift register 30 by way of the switches 38 to the input port 34. This summation creates the value $b_2(i)=b_1(i-1)-k_1f_1(i)$.

The process is continued through the computation of all of the $b_j$ values after which the computation of the $f_j(i+1)$ values are initiated at time 17 of sample i.

Figure 5:
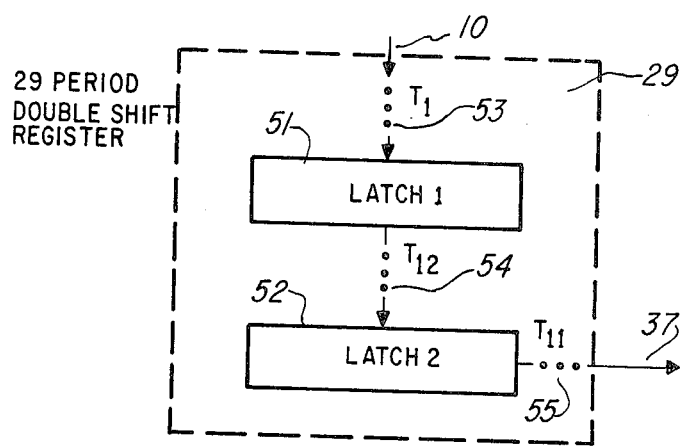
FIG. 5 is a block diagram of the double shift register illustrated in FIG. 3.

FIG. 5 is a diagram of the twenty-nine period double shift register 29 illustrated in FIG. 3.

The input 10 at time $t_1$ is communicated to the first latch 51 via the switch 53. This value is held in latch 51 until it is communicated at time $t_{12}$, or after, via the switch 54 to the second latch 52.

This arrangement allows the input value to be stored so as to be available at time $t_{11}$, via switch 55, and communicated over line 37 to the adder 27 (not shown), the twenty-period shift register 30, (not shown), and the six period shift register 28 (not shown).

Figure 6:
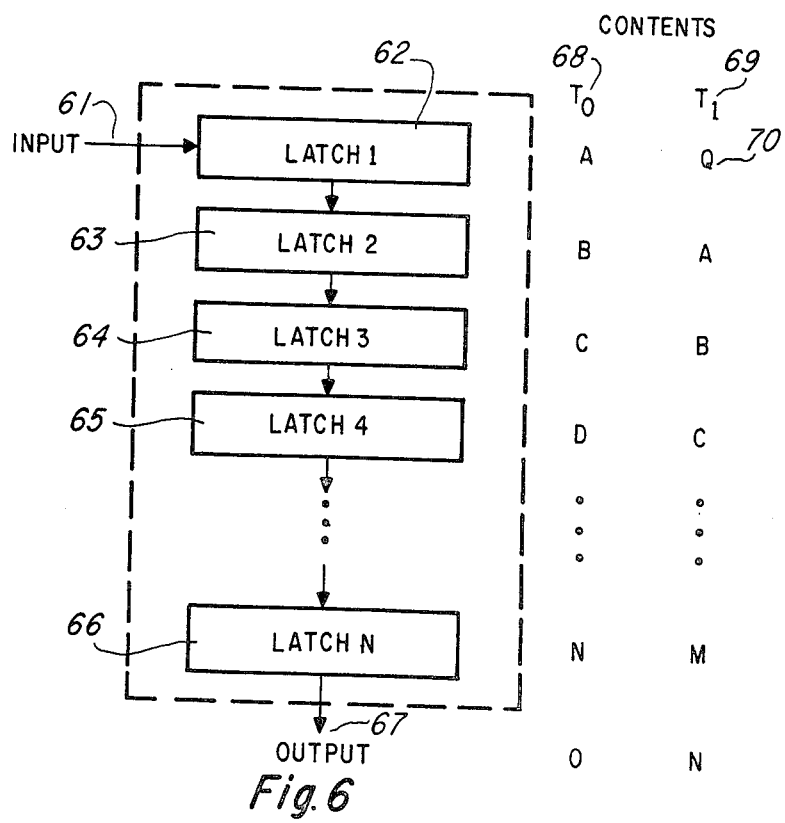
FIG. 6 is a block diagram and timing table illustrating the working of a shift register.

FIG. 6 is a block diagram of a standard shift register. This shift register exemplifies the twenty-period shift register 30, the six-period shift register 28, and the ten-period shift register 25 illustrated in FIG. 3.

The input 61 is stored in the first latch 62 until the next time iteration at which time it is moved down to the second latch 63. At the next successive time iteration the value is moved to the third latch 64, then to the fourth latch 65, etc. until it eventually arrives at the final latch 66. At the $N+1$ time iteration, the data which was the initial input becomes the output value 67. The purpose of the operation is to store and delay the output of a data value for N time units. By varying the number of latches, the amount of delay is thereby also varied.

By referring to the timing table and contents at time $t_0$, 68, the data within the various latches are designated by A, B, C, D . . . to N. At the next time iteration, the new input value Q, 70, is placed in the first latch 62 while the second latch 63 receives the value A. The contents of the latches at time $t_1$, 69, are Q, A, B, C, . . . . M. The output value at $t_1$ is N.

Figure 7:
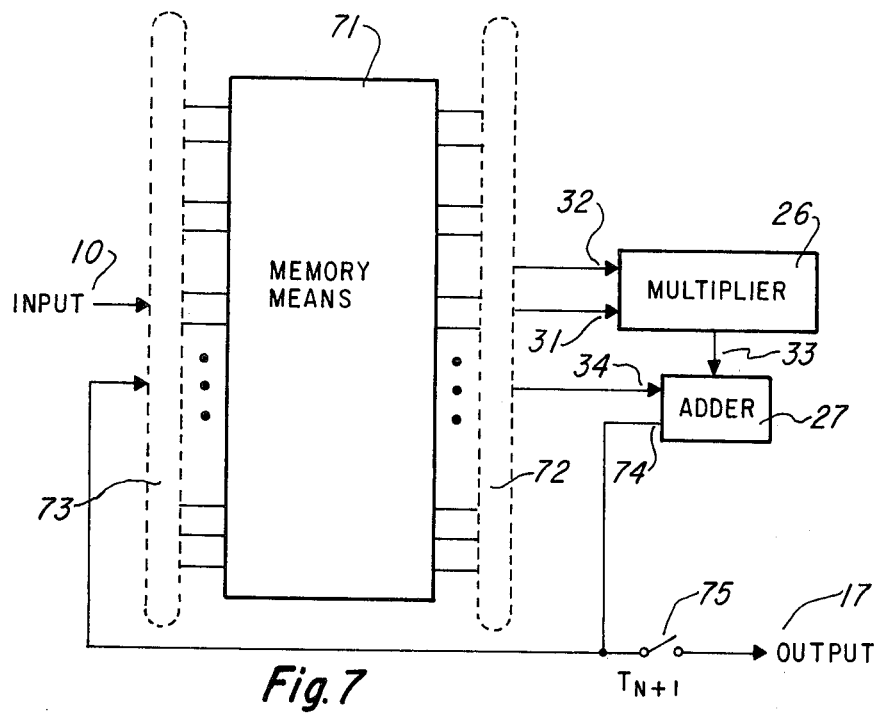
FIG. 7 is a block diagram of the filter utilizing memory means.

FIG. 7 is a block diagram of another embodiment of the invention. This embodiment utilizes a memory means as opposed to the use of shift registers exemplified in FIG. 3.

The input value 10 is accepted and stored appropriately via a switch or control means 73 in a memory means 71. At the appropriate time, the selected contents of the memory means 71 are withdrawn from the memory means 71 via the switch or control means 72 and communicated to the input port 31 and the input port 32 of the multiplier 26. As noted in FIG. 3, should the multiplier be a four-stage or multiple stage multiplier, the values must be communicated to the multiplier four time periods before the multiplication product is actually needed for use by the adder 27.

The output of the multiplier 26 is communicated to the input port 33 of the adder 27 while the second input port 34 of adder 27 receives its appropriate value from the memory means 71 as dictated by the control means 72.

The output 74 from the adder 27 is communicated back to the memory means 71 and appropriately stored via the control means 73.

In an N-stage lattice filter arrangement for this embodiment, the switch 75 at time $N+1$ is closed so as to supply the output 17.

It is clear that this embodiment utilizes a memory means and is more flexible in its operation than the use of a shift register. The control means 73 and control means 72 though require a great deal of interaction and monitoring.

Typically, if the memory means 71 contains 3N memory cells, N of these cells are used for storage of the $k_j$ values, N cells are used for storage of the $f_j$ values, and N cells are used for the storage of the $b_j$ values. Note that the $b_j$ values and $f_j$ values are updated and therefore an updateable memory means must be used. One such memory means is a random access memory (RAM). The $k_j$ values, should they not be updated or automatically correlated, are involatile and as such may be stored in a read only memory (ROM) portion of the memory means 71.

Figure 8:
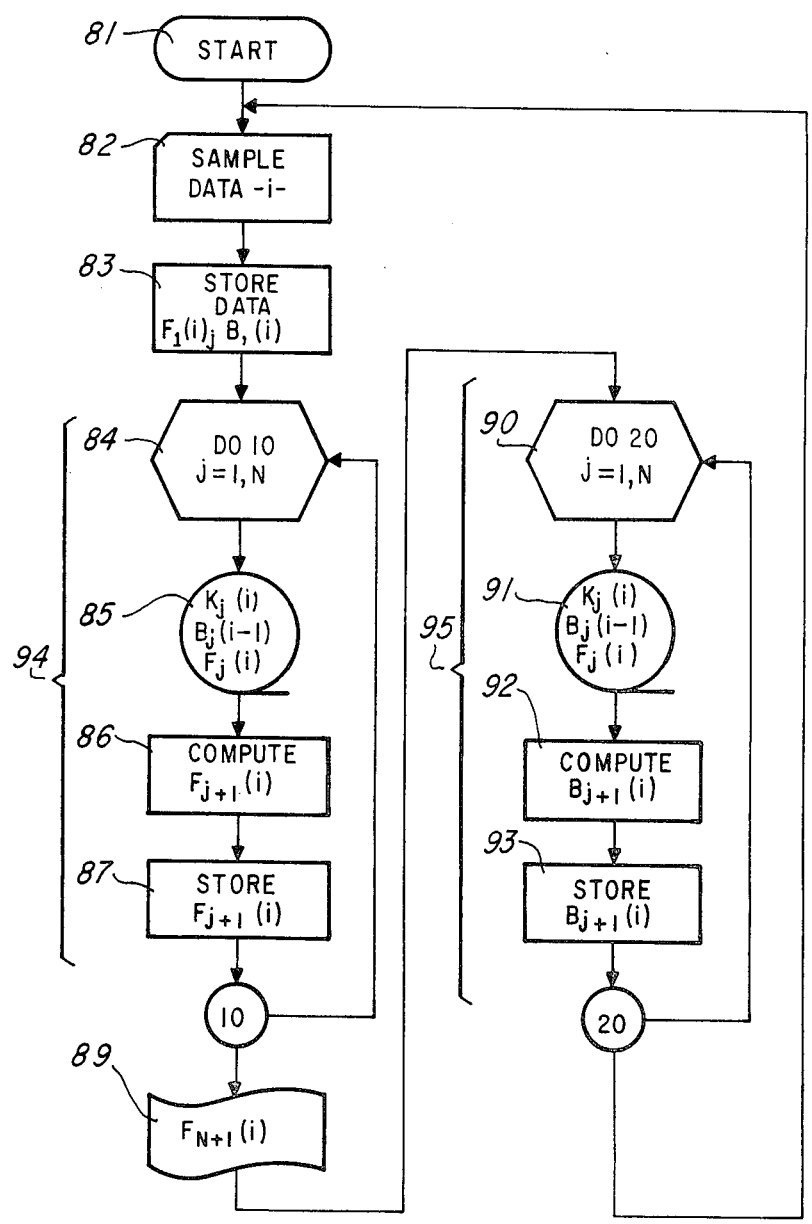
FIG. 8 is a flow chart of the controller operation of the embodiment of FIG. 7.

FIG. 8 is a flow chart describing the operation of the embodiment of the invention illustrated in FIG. 7.

After start 81, a speech data sample i, 82, is collected. The data is stored in its appropriate location 83 and the operation 94 of computing the $f_j$ values is begun.

The computation of the $f_j$ values involves the retrieval 85 from memory of the $k_j(i)$, the $b_j(i-1)$, and the $f_j(i)$ values. The determination of $f_{j+1}(i)$, 86, is performed and the value derived therefrom is stored 87. This operation is continued through the N stages at which time the final value $f_{N+1}(i)$ is displayed or stored 89.

The operation continues in the computation 95 of the $b_{j+1}(i)$ values. The operation is performed again through the N stages. The values of $k_j(i)$, $b_j(i-1)$, and $f_j(i)$ are retrieved from storage, 91. The value of $b_{j+1}(i)$ is computed, 92 and stored 93. Once the values are determined, the device returns to obtain a new speech data sample for $i+1$, the next speech data sample.

In this fashion, the values necessary for the N stage lattice filter are computed and stored for the device illustrated in FIG. 7.

Figure 9:
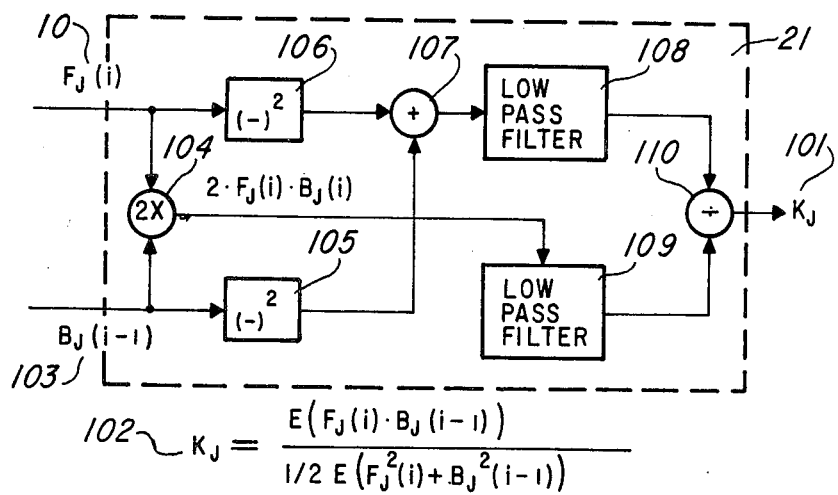
FIG. 9 is a block diagram of an embodiment of the correlator to update the $k_j$ values.

FIG. 9 is a block diagram of an embodiment of the correlator operation as illustrated in FIG. 2. In this case, the correlator 21 accepts the input of the $f_j(i)$ value 10 and the $b_j(i-1)$ value 103. The correlator 21 is to perform the operation of determining the value of the function 102 defined by $$k_j = \frac{E(f_j(i)b_j(i-1))}{(\frac{1}{2})E(f_j^2(i) + b_j^2(i-1))}$$

The function E, the expected value, is approximated by a low pass filter 108 and 109.

The input $f_j(i)$ 10 is communicated to the multiplier 104 and the square operator 106. The multiplier 104 is used to compute the independent variable of the numerator. The square operator 106 is utilized to compute the independent variable used in the denominator.

The resultant of the square operator 106 is communicated to the summer 107 which combines it with the square operator 105 of the input $b_j(i-1)$ 103. Once the summer 107 is complete with its operation, the independent variable is properly formed so as to be supplied to the low pass filter 108 which simulates the E function, for the denominator. In like fashion the low pass filter 109 simulates the E function on data from the multiplier 104 to form the independent variable for the numerator. The output of the low pass filter 109 is divided by the output of the low pass filter 108 via the divider 110 and hence develops the value 101 as the updated value for $k_j$.

Figure 10A:
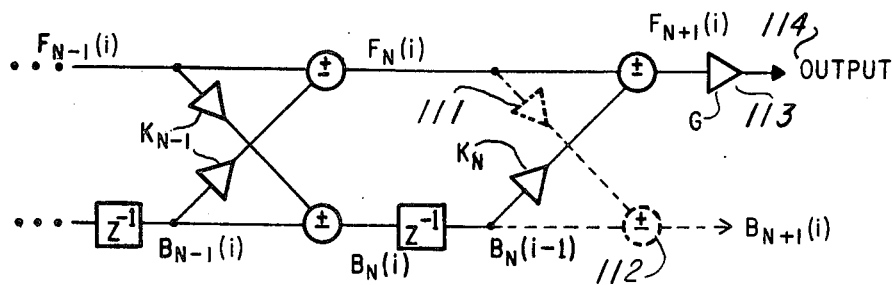
FIGS. 10a and 10b illustrate an embodiment of the lattice filter in which a gain factor multiplication is performed.
Figure 10B:
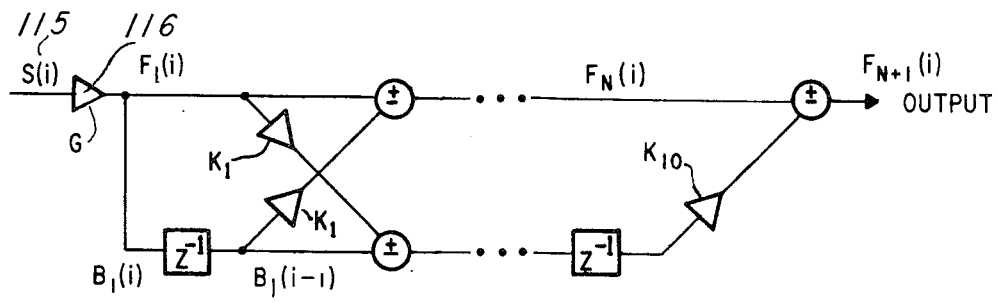

FIGS. 10a and 10b are schematic diagrams of an alternate embodiment for a lattice filter. The embodiments of FIGS. 10a and 10b eliminate the multiplication used to obtain the value for $b_{N+1}(i)$, and utilize this operation to add a gain factor multiplication either on the output, FIG. 10a, or on the input, FIG. 10b, of the lattice filter.

Specifically in FIG. 10a, the multiplier 111 and the summer 112 which would generate the value $b_{N+1}(i)$ are eliminated from the lattice filter. The multiplication operation is instead utilized upon the value $f_{N+1}(i)$ by a multiplier 113 to multiply the $f_{N+1}(i)$ value by a factor of G. The output 114 therefore has a gain factor figured into it so as to obtain a more informative set of data than the lattice filter as illustrated in FIG. 1. The lattice filter of FIG. 10a is identical in all respects to the lattice filter of FIG. 1 except for the elimination of the multiplier 111 and the summer 112 with the consequent elimination of the value $b_{N+1}(i)$, and the addition of the multiplier 113 to provide a gain factor multiplying the output value $f_{N+1}(i)$.

This modification of the lattice filter is available since the value of $b_{N+1}(i)$ is not utilized whatsoever in the lattice filter but is merely deleted after it has been computed. The computation of the value $b_{N+1}(i)$ therefore is not necessary for the performance of the lattice filter in speech analysis.

FIG. 10b is an alternate embodiment of the lattice filter which also deletes the value $b_{N+1}(i)$ by eliminating multiplier and summer required for its generation. In this embodiment, the speech data sample s(i) 115 multiplied by a gain factor of G by a multiplier 116 prior to its entry into the lattice network of the filter of FIG. 10b; hence, the gain factor is contributed at the start of the lattice filter as opposed to the last output of the lattice filter as illustrated in FIG. 10a. Again the deletion of the multiply operation and the add operation necessary to compute $b_{N+1}(i)$ is not detrimental to the operation of the lattice filter since this value is not utilized or stored.

Figure 11:
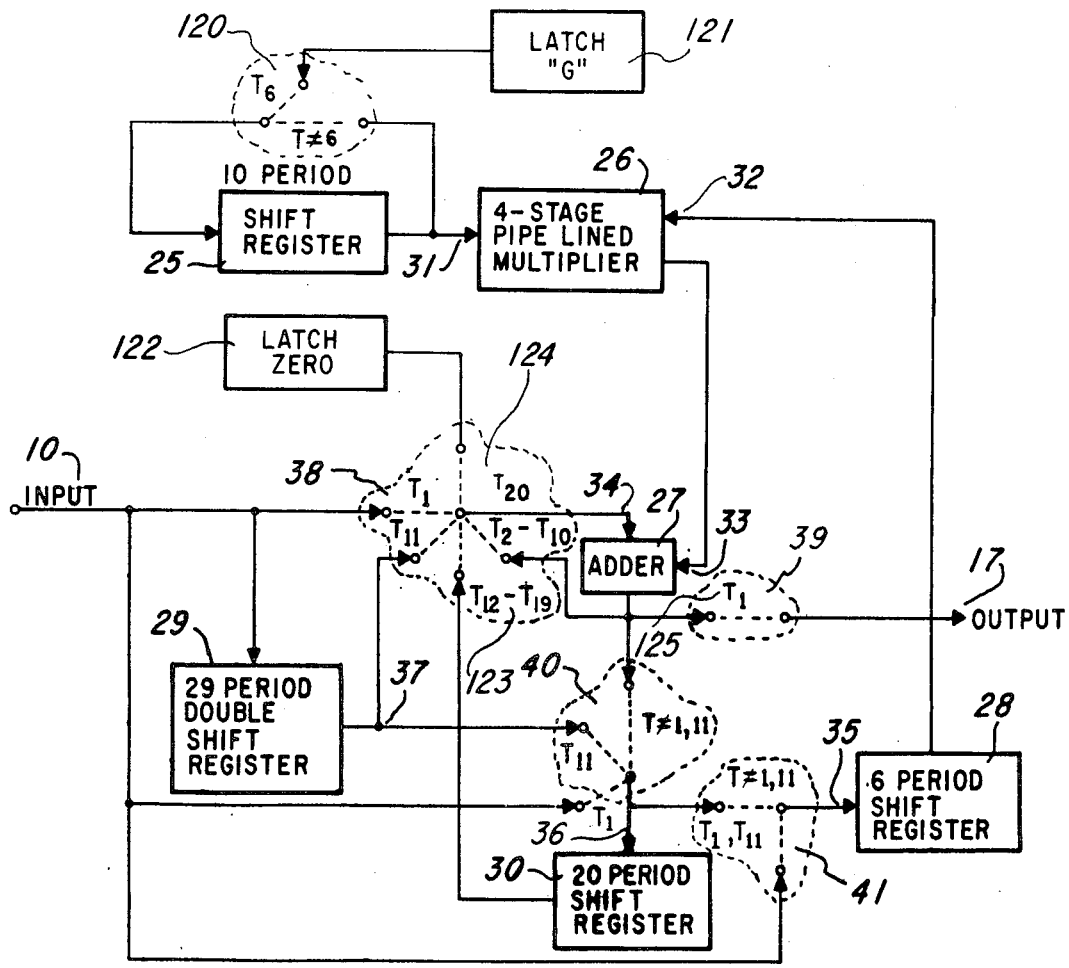
FIG. 11 is an architectural block diagram of an embodiment of the invention utilizing a gain factor multiplication.

FIG. 11 is a block diagram of an embodiment of the lattice filter illustrated in FIG. 10a. The operation of the lattice filter of FIG. 11 is identical to the lattice filter of FIG. 3 except that a latch 121 containing the value G is incorporated so as to supply the value G in the shift register 25 at time $t_6$ via the closing of switch 120. Additionally zero latch 122 is added with a switch 124 operating at time $t_{20}$, whereas the switch 38 connects the output of the twenty-period shift register 30 back to the input port 34 of the adder 27 during the time $t_{12}$ through $t_{19}$ only as shown at 123. The addition of the latch 121 and the zero latch 122 allows the final operation normally computing the value $b_{11}(i)$ to instead compute the value of $Gxf_{11}(i)+0$. The switch 39 is altered so that it closes as shown at 125 at time $t_1$ as opposed to the switch 39 of FIG. 3 which closes at time $t_{11}$. This fact is reflective of the multiplication of the gain factor at the last time increment so as to be available at the first time period of the next speech data sample.

FIG. 12 is a timing table for the lattice filter of FIG. 11. The timing table of FIG. 12 is almost identical to the timing table of FIG. 4.

The differences between the two timing tables lies in the fact that the gain factor G is communicated at time $t_{16}$, 130, to the multiplier input in the timing table of FIG. 12 as opposed to the factor of $k_{10}$ at time $t_{16}$ in the timing table of FIG. 4. This results in the value $Gxf_{10}(i)$ being available to the input to the adder at time $t_{20}$. When combined with the zero latch at time $t_{20}$, the resultant of $Gxf_{10}(i)+0$ is available at time $t_1$ of sample $i+1$ as the output of sample i.

This addition of a gain factor multiplying the output is highly advantageous in that it provides an improved lattice filter.

Through the use of this architectural arrangement and the use of a single multiplier and a single adder such as the embodiment of the lattice filter illustrated in FIG. 3, a lattice filter is formed which may be implemented on a chip without the need for a plurality of multipliers and adders in the voice analysis approach. The digital filter so formed is capable of being constructed upon a single silicon chip so as to reduce its cost and thereby create a portable and inexpensive unit for voice analysis and compression.

I claim:

1. A speech analysis device implementing an inverse lattice filter, said speech analysis device comprising:
    input means for receiving digital signals repesentative of speech;
    memory means storing a plurality of digital speech parameters representative of filter coefficients;
    a single multiplier means only, said multiplier means having first and second inputs and an output;
    said memory means being coupled to said first input of said multiplier means for providing digital speech parameters thereto;
    a single adder means only, said adder means having first and second inputs and an output;
    the output of said multiplier means being coupled to said first input of said adder means;
    said input means being adapted to be coupled to said second input of said adder means;

first and second delay means respectively adapted to be coupled to the output of said adder means and to said input means;

a first feed-back loop adapted to connect the output of said first delay means to said second input of said adder means;

a second feed-back loop connecting the output of said second delay means to said second input of said multiplier means;

a third feed-back loop adapted to connect the output of said adder means to said second input of said adder means;

first sequentially operable switching means interposed between the output of said adder means and the input of said first delay means and between said input means and the input of said first delay means and sequentially positionable in at least a first switching position connecting the output of said adder means to said first delay means but disconnecting said input means from said first delay means, and a second switching position connecting said input means to said first delay means but disconnecting the output of said adder means from said first delay means;

second sequentially operable switching means interposed between the output of said adder means and the input of said second delay means and between said input means and the input of said second delay means, said second delay means being serially arranged with respect to said first switching means, said second switching means being sequentially positionable in a first switching position connecting the input of said second delay means to the output of said adder means but disconnecting said input means from said second delay means, and a second switching position connecting said input means to said second delay means but disconnecting the output of said adder means from said second delay means;

third sequentially operable switching means interposed between said input means and said second input of said adder means and sequentially positionable in a plurality of switching positions to alternatively connect said input means to said second input of said adder means, to complete said third feed-back loop connecting the output of said adder means to said second input of said adder means, and to complete said first feed-back loop connecting the output of said first delay means to said second input of said adder means; and fourth switching means interposed in the output of said adder means at a position independent of said first and second switching means, said fourth switching means normally being open but closing at a predetermined time interval to enable the output of said adder means to provide an output signal of the speech analysis device.

2. A speech analysis device as set forth in claim 1, further including third delay means connected to said input means and adapted to be connected to said second input of said adder means and to the input of said first delay means by said third and first switching means at respective switching positions during the same time interval occurring when said first delay means is disconnected from the output of said adder means.

3. A speech analysis device as set forth in claim 2, wherein said first, second and third delay means comprise first, second and third shift registers, respectively.

4. A speech analysis device as set forth in claim 3, wherein said third shift register comprising said third delay means is a double shift register.

5. A speech analysis device as set forth in claim 4, wherein an N stage inverse lattice filter is implemented, and said memory means is provided with a preselected number of storage units equal to N.

6. A speech analysis device as set forth in claim 5, wherein said multiplier means comprises an M stage multiplier.

7. A speech analysis device as set forth in claim 6, wherein said second shift register comprising said second delay means has a predetermined number of storage units equal to N-M.

8. A speech analysis device as set forth in claim 7, wherein said first shift register comprising said first delay means has a predetermined number of storage units equal to 2N.

9. A speech analysis device as set forth in claim 8, wherein said memory means comprises a speech parameter shift register having N storage units, an input and an output, the output of said speech parameter shift register being coupled to said first input of said multiplier means, and a speech parameter feed-back loop coupling the output of said speech parameter shift register to said input of said speech parameter shift register.

10. A speech analysis device as set forth in claim 9, wherein $N=10$ and $M=1$.

11. A speech analysis device as set forth in claim 9, further including a first storage unit having a constant gain value stored therein;

a second storage unit having a zero value;

fifth switching means operably connected to said first storage unit and being interposed in said speech parameter feed-back loop, said fifth switching means normally being open but closing at a predetermined time interval to introduce said constant gain value from said first storage unit to the input of said speech parameter shift register for eventual output to said first input of said multiplier means; and said third switching means having an additional switching position operably connected to said second storage unit and to said second input of said adder means, and said third switching means being sequentially disposed in said additional switching position during a predetermined time interval to connect only said second storage unit to said second input of said adder means to introduce said zero value from said second storage unit to said second input of said adder means.

12. A speech analysis device as set forth in claim 11, wherein said constant gain value from said first storage unit is introduced to the input of said speech parameter shift register at a predetermined time interval to provide a multiplication gain factor to the output signal provided by the output of said adder means.

13. A speech analysis device as set forth in claim 1, further including means for updating the plurality of digital speech parameters representative of filter coefficients as stored in said memory means.

14. A speech analysis device implementing an N stage inverse lattice filter, said speech analysis device comprising:

input means for receiving digital signals representative of speech;

memory means having a plurality of storage units including at least 3N storage units wherein said storage units are allocated so as to provide N storage units for storage of digital speech parameters as k-values representative of filter coefficients, N storage units for storage of speech data samples as f-values, and N storage units for storage of corresponding speech data samples delayed in time as b-values;

input and output control means operatively associated with said memory means for controlling data inputs thereto and data outputs therefrom in a predetermined operating sequence;

a single multiplier means only, said multiplier means having first and second inputs and an output;

said memory output control means being coupled to said first and second inputs of said multiplier means for providing first and second speech data values thereto from said memory means;

a single adder means only, said adder means having first and second inputs and an output;

said memory input control means coupling said input means and said output of said adder means to said memory means for providing inputs thereto in accordance with the predetermined operating sequence;

said output of said multiplier means being coupled to said first input of said adder means;

said memory output control means being coupled to said second input of said adder means for providing memory outputs to said adder means in accordance with said predetermined operating sequence;

switching means operatively connected to the output of said adder means, said switching means normally being open but closing at a predetermined time interval to enable the output of said adder means to provide an output signal of the speech analysis device;

said memory input control means accepting a digital signal as an externally supplied speech data sample value from said input means and storing said externally supplied speech data sample value in the first of said N storage units for storage of f-values within said memory means;

said memory output control means providing selected data from one of said N storage units for storage of k-values in said memory means as a first speech data value to said first input of said multiplier means and providing selected data from one of said N storage units for storage of b-values in said memory means as a second speech data value to said second input of said multiplier means;

said multiplier means providing output data indicative of intermediate products during a multi-stage multiplying operation cycle and a final product in the last multiply operation of each multiply operation cycle to said first input of said adder means;

said memory output control means providing selected data from one of said N storage units for storage of f-values in said memory means to said second input of said adder means;

the output from said adder means providing data to said memory means via said memory input control means for storing in said memory means in a selected one of said N storage units for storage of f-values;

said predetermined operating sequence in defining the f-values involving N iterations of the multiply and add functions via said multiplier means and said adder means with different first and second speech data values being provided to the first and second inputs of said multiplier means and different selected data being provided to said second input of said adder means for each iteration;

said memory output control means further providing selected data from one of said N storage units for storage of k-values in said memory means as a first speech data value to said first input of said multiplier means and providing selected data from one of said N storage units for storage of f-values in said memory means as a second speech data value to said second input of said multiplier means;

said multiplier means providing output data indicative of intermediate products during a multi-stage multiplying operation cycle and a final product in the last multiply operation of each multiply operation cycle to said first input of said adder means;

said memory output control means further providing selected data from one of said N storage units for storage of b-values in said memory means to said second input of said adder means;

said adder means providing to said memory means via said memory input control means data from the output of said adder means for storing in a selected one of said N storage units for storage of b-values in said memory means; and said predetermined operating sequence in defining the b-values involving an additional N iterations of the multiply and add functions via said multiplier means and said adder means with different first and second speech data values being provided to the first and second inputs of said multiplier means and different selected data being provided to said second input of said adder means for each iteration.

15. A speech analysis device as set forth in claim 14, wherein the f-values are defined by N functions determined by $$f_{j+1}(i) = f_j(i) - k_j b_j(i-1)$$

and the b-values are defined by N functions determined by $$b_{j+1}(i) = b_j(i-1) - k_j f_j(i), \text{ for } 2 \leq j \leq N, \text{ wherein:}$$

$k_j$ = a preselected constant value,
i = a speech data sample number, and
$f_1(i) = b_1(i)$ = the externally supplied speech data sample value.

16. A speech analysis device as set forth in claim 15, wherein said multiplier means comprises an M stage multiplier.

17. A speech analysis device as set forth in claim 16, wherein N=10, and M=4.

* * * * *